US009562789B2

(12) United States Patent
Philippe et al.

(10) Patent No.: US 9,562,789 B2
(45) Date of Patent: Feb. 7, 2017

(54) SENSOR FOR MAGNETIC FIELDS WITH LAPLACE FORCE

(71) Applicant: Commissariat à l'énergie atomique et aux énergies alternatives, Paris (FR)

(72) Inventors: Robert Philippe, Grenoble (FR); Dirk Ettelt, Gelsenkirchen (DE); Arnaud Walther, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 77 days.

(21) Appl. No.: 14/408,176

(22) PCT Filed: Jun. 14, 2013

(86) PCT No.: PCT/EP2013/062432
§ 371 (c)(1),
(2) Date: Dec. 15, 2014

(87) PCT Pub. No.: WO2013/186383
PCT Pub. Date: Dec. 19, 2013

(65) Prior Publication Data
US 2015/0123656 A1    May 7, 2015

(30) Foreign Application Priority Data

Jun. 15, 2012 (FR) ..................... 12 55597

(51) Int. Cl.
*G01D 5/12* (2006.01)
*G01R 33/028* (2006.01)
(Continued)

(52) U.S. Cl.
CPC ................ *G01D 5/12* (2013.01); *G01H 11/00* (2013.01); *G01L 1/00* (2013.01); *G01R 33/0283* (2013.01);
(Continued)

(58) Field of Classification Search
CPC .......... G01D 5/12; G01D 5/142; G01D 5/145; G01D 5/147; G01H 11/00; G01L 1/00; G01R 33/038; G01R 33/0283; G01R 33/0286; G01R 33/06
See application file for complete search history.

(56) References Cited

U.S. PATENT DOCUMENTS 7,315,161 B2 *   1/2008   Zribi .................. G01R 33/0283
                                                       324/117 R
7,642,692 B1     1/2010   Pulskamp
                          (Continued)

FOREIGN PATENT DOCUMENTS

WO         2010084165          7/2010

OTHER PUBLICATIONS

Beroulle et al., "Monolithic piezoresistive CMOS magnetic field sensors," Sensors and actuators A, vol. 103, pp. 23-32 (2003).
(Continued)

*Primary Examiner* — Julian Huffman
*Assistant Examiner* — Michael Konczal
(74) *Attorney, Agent, or Firm* — Occhiuti & Rohlicek LLP

(57) ABSTRACT

A magnetic field sensor comprises a substrate and a moving part which is displaced when subjected to a Laplace force. There is a gauge for measuring the displacement of the moving part. There is a suspended lever that is rotationally displaced about an axis of rotation at right angles to the direction of displacement of the moving part. The lever is connected to the moving part to transmit displacement of the moving part to the lever to cause rotation of the lever about the axis of rotation. The lever is also connected to a first part of the gauge. The sensor comprises a hinge that connects the lever to the substrate. The hinge allows the rotation of the lever about its axis of rotation and is rigid to allow for a lever
(Continued)

arm effect. The second part of the gauge is fixed with no degree of freedom to the substrate.

13 Claims, 6 Drawing Sheets

(51) Int. Cl.
   *G01H 11/00* (2006.01)
   *G01L 1/00* (2006.01)
   *G01R 33/038* (2006.01)
(52) U.S. Cl.
   CPC ......... *G01R 33/0286* (2013.01); *G01R 33/038* (2013.01)

(56) References Cited

U.S. PATENT DOCUMENTS

| | | | |
|---|---|---|---|
| 8,418,556 B2* | 4/2013 | Chen | G01R 33/0286 |
| | | | 73/514.32 |
| 8,461,833 B2* | 6/2013 | Classen | B81C 99/003 |
| | | | 324/200 |
| 8,847,589 B2* | 9/2014 | Walther | G01R 33/022 |
| | | | 310/12.03 |
| 8,947,081 B2* | 2/2015 | Seeger | G01R 33/0286 |
| | | | 324/252 |
| 2006/0076947 A1 | 4/2006 | Berkcan et al. | |

OTHER PUBLICATIONS

Herrera-May et al., "A resonant magnetic field microsensor with high quality factor at atmospheric pressure," J. Micromechanical Microengineering, 19 (2009).

* cited by examiner

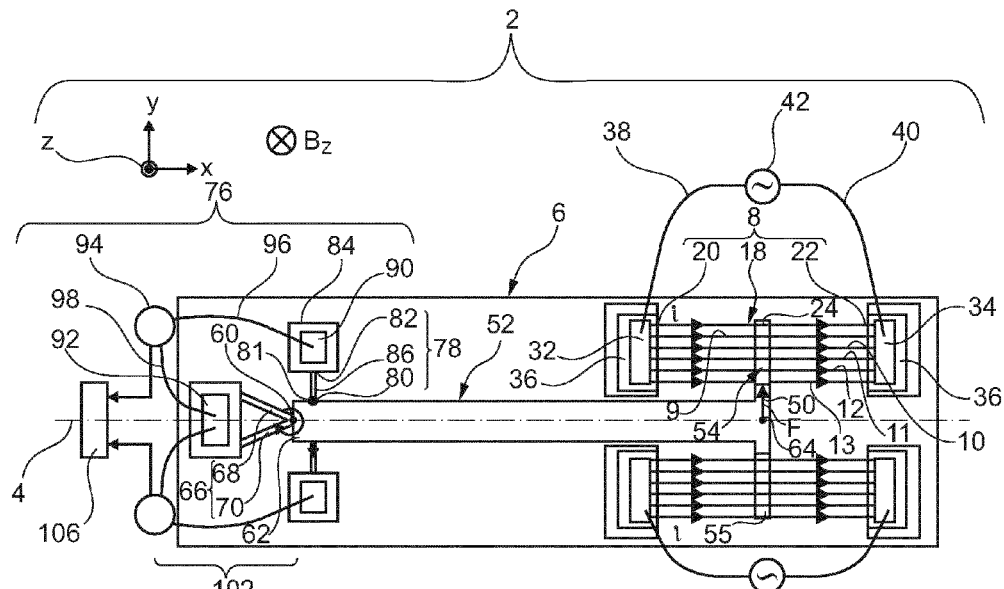
Fig. 1
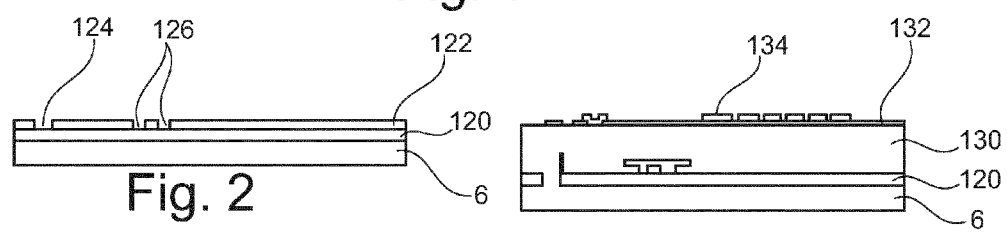
Fig. 2 / Fig. 6
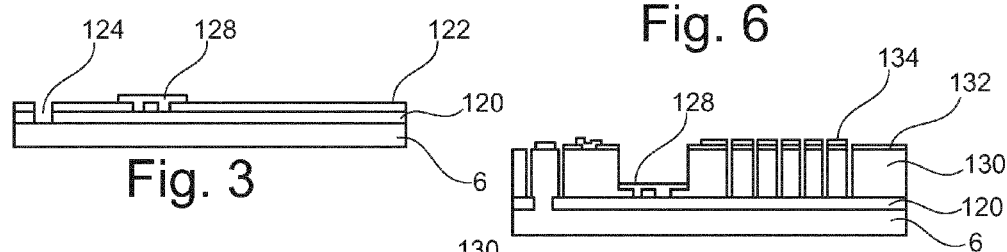
Fig. 3 / Fig. 7
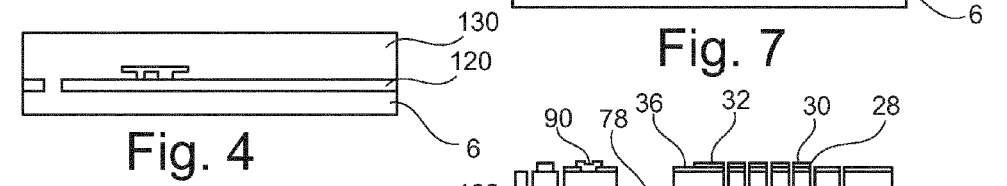
Fig. 4
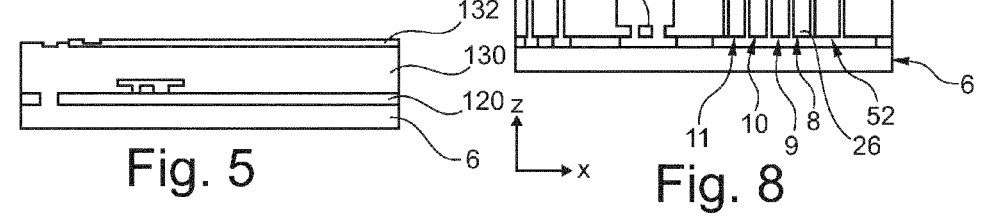
Fig. 5 / Fig. 8

SENSOR FOR MAGNETIC FIELDS WITH LAPLACE FORCE

RELATED APPLICATIONS

This application is a U.S. National Stage of international application number PCT/EP2013/062432 filed Jun. 14, 2013, which claims the benefit of the priority date of French Patent Application FR 1255597, filed Jun. 15, 2012, the contents of which are herein incorporated by reference.

FIELD OF INVENTION

The invention relates to a magnetic field sensor with Laplace force and to a method for using this sensor.

BACKGROUND

The magnetic field sensors with Laplace force can be used to measure a component of the Earth's magnetic field or a component of a magnetic field generated by an electrical conductor or another magnetic field source.

The expression "component of the magnetic field" designates the amplitude of the orthogonal projection of the magnetic field on a measurement axis of the sensor.

Known sensors comprise:

a substrate extending essentially in a plane called substrate plane, at least one electrical conductor suitable for an electrical current to flow through, this electrical conductor comprising a moving part, suspended over the substrate, suitable for being displaced in a direction of displacement when it is subjected to a Laplace force, mechanical links mechanically connecting this moving part to the substrate and electrically connecting the moving part to current power supply contact blocks arranged on the substrate, at least one gauge suitable for measuring a physical quantity representative of the amplitude of the displacement of the moving part, this gauge comprising at least one first and one second parts, a suspended lever that can be rotationally displaced about an axis of rotation at right angles to the direction of displacement of the moving part, this lever comprising a first and a second attachment points, the first attachment point being mechanically connected to the moving part to drive the lever in rotation about the axis of rotation in response to a displacement of the moving part, and the second attachment point being directly mechanically connected to the first part of the gauge.

For example, such sensors are described in the following papers A1 and A2:

A1: V. Beroulle et al., "Monolithic piezoresistive CMOS magnetic field sensors", Sensors and actuators A, vol 103, pages 23-32, 2003, A2: A. L. Herrera-May et al., "A resonant magnetic field microsensor with high quality factor at atmospheric pressure", J. Micromechanical Microengineering, 19 (2009) 015016.

Prior art is also known from:
U.S. Pat. No. 7,642,692 B1, and
US 2006/076947.

It is desirable to optimize these sensors, notably to enhance their sensitivity or set their bandwidth. However, in practice, this task proves particularly difficult to carry out. This point is illustrated by the following few examples.

To increase the sensitivity of the sensor described in the paper A1 or A2, moving the electrical conductor on which the Laplace force is exerted away from the gauge by increasing the length of the lever could be envisaged. In effect, increasing the length of the lever makes it possible to increase the force which is exerted on the gauge, and therefore increase the sensitivity of the sensor. However, increasing the length of the lever alters the resonance frequency of the lever. Now, the electrical conductors of the sensors of the papers A1 and A2 have to be powered with an alternating current whose frequency is chosen to be equal to the mechanical resonance frequency of the lever. Consequently, increasing the length of the lever results in working at frequencies which can be located outside the desired working frequency range. For example, the lower the working frequency, the more sensitive the sensor is to mechanical vibrations. Furthermore, in the case of the papers A1 and A2, the gauges are integrated on the lever. In these conditions, for the gauges to be able to measure a strain variation, the lever has to be deformable. In effect, if it is not deformable, the gauges do not measure any signals. Consequently, since the lever is deformable, there is no mechanical lever arm effect to be directly profited from by increasing the length of the lever. To obtain this effect, the lever would have to be rigid.

In the known sensors, if a given bandwidth is desired for the sensor, it is also necessary to adjust the length of the lever and/or the stiffness of the mechanical links. In the same way as what has been stated above, these modifications also necessarily alter the sensitivity of the sensor, which is not desired.

Finally, in the known sensors, it is also possible to envisage reducing the stiffness of the mechanical links to increase the amplitude of the displacement of the moving part of the electrical conductor. However, yet again, such a modification cannot be made without altering other aspects of the operation of the sensor such as its resonance frequency.

SUMMARY

The invention therefore aims to propose a magnetic field sensor with Laplace force whose architecture is easier to optimize.

In the above sensor, by virtue of the fact that the hinge which connects the lever to the substrate is distinct from the mechanical and electrical links of the conductor, it is possible to separately optimize the mechanical characteristics of the conductor and of the lever. For example, in the above sensor, the mechanical resonance frequency is essentially determined by the mechanical characteristics of the lever, of the hinge and of the gauge. Furthermore, it is possible to obtain a significant lever arm effect because:

the lever is rigid, and the gauge is fixed at one of its ends to the rigid lever and at the other end to a fixed embedment, which makes it possible to have an optimized sensitivity.

"Rigid" lever here designates a lever whose bending stiffness, at the first attachment point, in the direction of displacement of the moving part, is greater, and preferably at least ten or a hundred times greater, than the compression mode stiffness of the gauge. The bending mode stiffness of the lever is that which can be measured or calculated when the hinge is replaced by an anchorage of infinite stiffness and that does not allow any degree of freedom. The compression mode stiffness of the gauge is the compression mode stiffness of the piezoresistive beam when this gauge comprises a piezoresistive beam.

Conversely, it is also possible to optimize the mechanical characteristics of the conductor to increase the amplitude of its displacement in response to a magnetic field without altering the characteristics of the lever and of the hinge.

This independence of the mechanical characteristics of the lever and of the conductor therefore simplifies the optimizing and dimensioning of the different elements of the sensor. In particular, this makes it possible to develop more sensitive sensors.

The embodiments of this sensor can comprise one or more of the features of the dependent claims.

These embodiments also offer the following advantages:

placing the second attachment point closer to the axis of rotation of the lever than the first attachment point makes it possible to amplify the force exerted by the conductor;

using a suspended strain gauge increases the sensitivity of the sensor because all of the mechanical strain to be measured is concentrated in the gauge whereas, when the gauge is placed on a beam, a portion of the strain to be measured goes into the beam;

reducing the cross section of the strain gauge makes it possible to increase the sensitivity of the sensor;

using two gauges placed on either side of the lever makes it possible to perform a more robust differential measurement;

distributing the weight of the lever so that its center of gravity is close to its axis of rotation renders the sensor more insensitive to impacts and vibrations;

having first and third attachment points that are symmetrical relative to the axis of rotation of the lever renders the sensor more insensitive to impacts and vibrations;

having a rigid moving part simplifies the optimizing of the form of the conductor because the moving part does not have to be deformed under the effect of the Laplace force to be displaced;

connecting the moving part to the first attachment point of the lever via a mechanical link in meander form limits the transmission of unwanted deformation of the conductor to the lever;

the use of a plurality of conductors in parallel increases the sensitivity of the sensor.

Another subject of the invention is a method for using the above sensor. The method may include supplying the electrical conductor with an alternating current of fundamental frequency $f_A$, and acquiring the signal representative of the amplitude of the displacement of the moving part. The method may also include determining the measurement of the magnetic field only from the components of the acquired measurement signal having a frequency lying within the width at −3 dB of the resonance peak centered on the frequency $f_A$ in the power spectral density of the acquired signal, and determining a measurement of an acceleration in the direction of displacement of the electrical conductor only from the components of the same acquired measurement signal having a frequency at least four times less than the frequency $f_A$.

The invention will be better understood on reading the following description, given solely as a nonlimiting example and with reference to the drawings

BRIEF DESCRIPTION OF THE DRAWINGS

FIG. 1 is a schematic illustration of a first embodiment of a magnetic field sensor with Laplace force, FIGS. 2 to 8 are schematic illustrations of different steps in manufacturing the sensor of FIG. 1, FIGS. 9, 11, 12, 14 to 18 and 20 are schematic illustrations in plan view of other possible different embodiments of a sensor with Laplace force.

DETAILED DESCRIPTION

Figure 9:
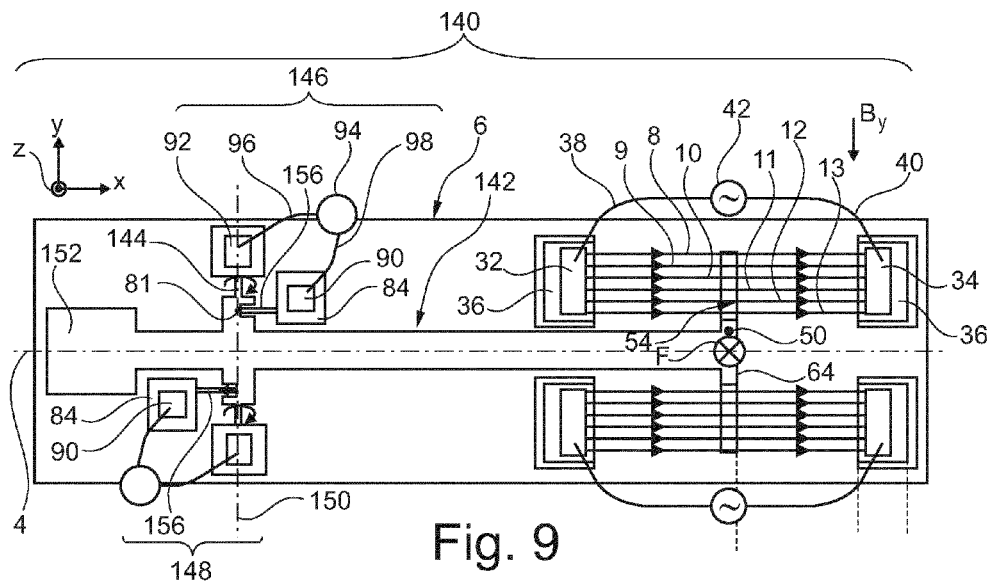

In the figures, the same references are used to designate the same elements. Hereinafter in this description, the features and functions that are well known to those skilled in the art are not described in detail.

FIG. 1 represents a magnetic field sensor 2 with Laplace force. More specifically, this sensor 2 is suitable for measuring the amplitude of a component $B_Z$ of the magnetic field. The component $B_Z$ is represented by a cross situated inside a circle. The component $B_Z$ is at right angles to the plane of the sheet and parallel to an axis Z of an orthogonal reference frame X, Y, Z. The axes X and Y are horizontal.

The sensor 2 is symmetrical relative to a vertical plane 4 parallel to the directions X and Z. Consequently, only the elements of the sensor 2 situated on the top side of this plane 4 are described in detail.

The sensor 2 comprises a substrate 6 which extends essentially in a horizontal plane called "substrate plane". Typically, the dimensions of this substrate 6 are less than 1 mm². For example, its length is less than 1 mm or 500 μm, and its width is less than 500 μm or 300 μm.

The substrate 6 is produced in a material that can be machined by microelectronic techniques, that is to say the same techniques as those used to produce electronic components such as transistors. For example, the substrate 6 is a semiconductor substrate such as silicon.

The sensor 2 comprises electrical conductors 8 to 13. Here, each of these conductors 8 to 13 is rectilinear and extends parallel to the direction X. In this embodiment, the conductors 8 to 13 are identical to one another, and only the conductor 8 will now be described in more detail.

The conductor 8 comprises a moving part 18 situated between two mechanical links 20 and 22. The mechanical links 20 and 22 mechanically connect the conductor 8 to the substrate 6.

The moving part 18 is suspended above the substrate. Here, "suspended" describes an element mechanically isolated from the substrate, in the direction Z, by a void in which a vacuum is formed or which is filled with a gas. This element is therefore suitable for being displaced relative to the substrate.

The moving part 18 is intended to be displaced along a direction of displacement parallel to the direction Y under the effect of the Laplace force which appears when this moving part has a current i passing through it in the presence of the component $B_Z$. Typically, the Laplace force which is exerted on the moving part 18 is given by the following relationship:

$$\vec{F} = i\vec{dl} \wedge \vec{B_Z}$$

in which:

F is the Laplace force which is exerted on the moving part 18, i is the intensity of the current flowing in the conductor 8, dl is the length of the conductor 8, $B_Z$ is the component of the magnetic field to be measured, and the symbol "A" is the mathematical vector product operation.

Here, the conductor 8 is a rectilinear bar of square or rectangular vertical section. The section of this bar is such that the bar is elastically deformed in the direction Y or in the opposite direction when it is subjected to a Laplace force. More specifically, here, this bar is curved in a horizontal plane.

The maximum amplitude of the displacement of the moving part 18 occurs at mid-distance between the links 20 and 22, that is to say at a mid-point 24.

In this embodiment, the bar is formed by the stack, working from bottom to top:

of a beam 26 (FIG. 8) in semiconductive material, of a layer 28 (FIG. 8) in electrically insulating material, of a layer 30 (FIG. 8) in electrically conductive material.

Here, "electrically conductive material" describes a material whose electrical conductivity is greater than $10^5$ or $10^6$ S·m$^{-1}$ at 20° C.

The conductive layer 30 extends over the links 20 and 22 to electrically connect the electrical conductor 8 to electrical power supply contact blocks 32 and 34. These contact blocks 32 and 34 are also produced in an electrically conductive material. Thus, the links 20 and 22 also ensure the electrical connection of the conductor to the contact blocks 32 and 34.

These contact blocks 32 and 34 are fixed with no degree of freedom onto the substrate 6. They are electrically insulated from this substrate 6 by an insulating layer 36 (FIG. 1 and FIG. 8).

The contact blocks 32 and 34 are electrically connected via wire links, respectively 38 and 40, to a current source 42. Here, this source 42 is an alternating current source.

The mid-point 24 of each conductor 8 to 13 is mechanically connected to one and the same attachment point 50 of a rigid lever 52 via a mechanical link 54. Here, the link 54 is a rectilinear small beam 55 which extends parallel to the direction Y and which passes through each of the mid-points 24 of each conductor 8 to 13 until it reaches the attachment point 50. The small beam 55 is fixed, with no degree of freedom in the axis of displacement, at each of the mid-points 24 and at the attachment point 50. For example, the small beam 55 forms only a single block of material with the beams 26 of the electrical conductors 8 to 13 and the lever 52.

Thus, the link 54 transforms any displacement of the mid-point 24 parallel to the direction Y into a displacement of the same amplitude and of the same direction of the attachment point 50.

To this end, the small beam 55 is suspended over the substrate 6. It is held suspended by, on one side, the mid-points 24 and, on the other side, the attachment point 50. The small beam 55 is displaced only in translation along the direction Y.

The small beam 55 and the lever 52 are electrically insulated from the conductors 8 to 13 by the presence of the layer 28 of insulating material on which the electrical conductors are positioned.

The lever 52 makes it possible to amplify the Laplace force which is exerted on the conductors 8 to 13 by a lever arm effect. To this end, the lever 52 is mounted to be able to be rotationally displaced about a vertical axis 60 fixed with no degree of freedom to the substrate 6. In its rest position, represented in FIG. 1, the greatest length of the lever 52 extends parallel to the direction X between a proximal end 62 and a distal end 64. The attachment point 50 is situated at the distal end 64. The axis 60 is situated at the proximal end 62. The lever 52 here extends in the plane 4 of symmetry.

The lever 52 is rectilinear. It is suspended over the substrate 6, at the proximal end 62, by a hinge 66 and, at the distal end 64, by the link 54.

In this embodiment, the lever 52 does not support any electrical conductor on which a Laplace force could be exerted. Typically, the length of the lever 52 is less than 2 mm or 500 μm and, generally, greater than 50 μm or 100 μm.

The lever 52 is rigid. Here, "rigid" describes the fact that its cross section and the material in which it is produced have been chosen in such a way that its bending mode stiffness, at the attachment point 50, in the direction of application of the Laplace force to be measured, is greater, and preferably at least ten or a hundred times greater, than the compression mode stiffness of the suspended piezoresistive beams which also attach this lever to the substrate 6. These piezoresistive beams are described later. The bending mode stiffness is, for example, measured or calculated by replacing the hinge by an anchorage of infinite stiffness and that has no degree of freedom. For the lever 52, the direction of application of the Laplace force is parallel to the direction Y.

The hinge 66 essentially allows the rotation of the lever 52 about the axis 60. For example, the hinge 66 is formed by two vertical plates 68 and 70 that are symmetrical to one another relative to the plane 4. These two plates meet at the axis 60 and move away from one another with increasing distance away from the axis 60 in the direction X.

The sensor 2 comprises a strain gauge 76 used to measure the angular travel of the lever 52 about the axis 60. Here, this gauge 76 comprises a piezoresistive beam or wire 78 to transform the angular displacement of the lever 52 into a measurable resistance variation. This beam 78 comprises:

a part 80 anchored with no degree of freedom in the lever 52 at an attachment point 81, a part 82 anchored with no degree of freedom to a bump 84 on the substrate 6, and a part 86 suspended over the substrate 6.

The thickness of the beam 78 is advantageously at least two, five or ten times less than the thickness of the lever 52 so as to concentrate the strain exerted by the lever 52 within a reduced surface area which increases the sensitivity of the sensor 2. Also preferably, the cross section of the beam 78 is several times less than that of the lever 52 to decrease its tensile-compressive stiffness.

For example, the beam 78 is produced in silicon or SiGe, an alloy of silicon and germanium. It can also be produced in metal. More generally, it can be produced in any material whose piezoresistive sensitivity expressed by the ratio (dR/R)/(dl/l) is equal to or greater than the sensitivity of the materials previously cited, in which:

dR is the resistance variation of the beam 78,

R is the resistance of the beam 78 at rest, that is to say in the absence of strain, dl is the variation of the length of the beam 78 when it is subjected to a strain to be measured, l is the length at rest of the beam 78.

Here, the beam 78 extends parallel to the direction Y.

The attachment point 81 is as close as possible to the axis 60 to maximize the benefit from the Laplace force amplification effect provoked by the lever 52. To this end, the shortest distance between the attachment point 81 and the axis 60 is less than a tenth or a fiftieth of the length of the lever 52 in the direction X. For example, this distance is less than 5 or 10 µm. However, the attachment point 81 is not situated on the axis 60 for the amplification effect to exist.

The gauge 76 also comprises two electrical contact blocks 90 and 92 and an ohm meter 94. Here, ohm meter should be understood to mean any device capable of measuring a resistance variation, directly or indirectly. In practice, it will be possible for example to use a voltage measurement through a Wheatstone bridge. The contact blocks 90 and 92 are directly electrically connected, respectively, to the parts 82 and 80 of the beam 78. Here, "directly" describes the fact that the connection does not pass via the beam 78 or the ohm meter 94.

The contact block 92 is electrically connected to the part 80 via plates 68 and 70 and the proximal end 62. To this end, the plates 68, 70 and the proximal end 62 can be covered with an electrically conductive material.

The ohm meter 94 is electrically connected to the contact blocks 90 and 92 via wire links, respectively, 96 and 98. This ohm meter 94 measures the resistance variation of the beam 78 in respect to the strain exerted on it by the lever 52 and generates a measurement signal representative of the measured resistance.

The sensor 2 also comprises another strain gauge 102 which comprises a piezoresistive beam that is symmetrical to the beam 78 relative to the plane 4. The gauge 102 measures a displacement of the same amplitude as the gauge 76 but of opposite direction.

The gauges 76 and 102 are connected to an electronic processing unit 106. The unit 106 is programmed to compute the amplitude of the component $B_Z$ as a function of the measurement signals delivered by the gauges 76 and 102.

The resonance frequency $f_R$ of the sensor 2 is essentially set by the lever 52, the hinge 66 and the beams 78. Here, the dimensions of the lever 52 and of the hinge 66 are chosen such that the frequency $f_R$ is greater than 1 kHz and, preferably, greater than 10 kHz. By virtue of the architecture of the sensor 2, it is not necessary to modify the electrical conductors 8 to 13 to set this frequency $f_R$.

The operation of the sensor 2 is as follows. The source 42 generates an alternating current at the frequency $f_A$, which is, advantageously, equal at the resonance frequency $f_R$. The Laplace force is exerted on the conductors 8 to 13 sometimes in the direction Y and sometimes in the opposite direction. This excites the sensor 2 at this frequency $f_A$. The lever 52 then oscillates about the axis 60. The angular amplitude of these oscillations is representative of the Laplace force which is exerted and therefore of the amplitude of the component $B_Z$. The gauges 76 and 102 generate measurement signals representative of the amplitude of the angular travel of the lever 52 and transmit these signals to the unit 106. The unit 106 computes the amplitude of the component $B_Z$ of the magnetic field from these signals.

FIGS. 2 to 8 represent different successive steps in the fabrication of the sensor 2. FIGS. 2 to 8 are views in vertical cross section of different elements of the sensor 2. These different elements have been juxtaposed in these views, even though they are not alongside one another in the sensor 2. Thus, these views do not correspond to a cross section of the sensor 2 along a cross-sectional plane but simply illustrate the fabrication of the different elements without taking into account their arrangement relative to one another in the sensor 2.

Fabrication begins with the supply of an SOI (silicon-on-insulator) substrate. This substrate comprises the substrate 6, a layer 120 (FIG. 2) in electrically insulating material such as silicon oxide and a layer 122 (FIG. 2) of silicon. For example, the layers 120 and 122 respectively have thicknesses equal to 1 µm and 0.3 µm.

Next, the layer 122 is etched by photolithography in such a way as to form a hole 124 and two holes 126 (FIG. 2). The hole 124 is used to produce an electrical contact block with the substrate 6. The two holes 126 are used to produce the piezoresistive beam 78 of the gauge 76.

Next, a layer of oxide 128 (FIG. 3) is deposited on the layer 122. For example, the thickness of the layer 128 is 0.3 µm.

The layer 128 is etched using a photolithographic method to allow only the parts of the layer 128 which fill and cover the two holes 126 to remain. During these etching steps, the layer of oxide at the bottom of the hole 124 is also eliminated to leave the substrate 6 exposed to the outside.

Next, a layer 130 (FIG. 4) of silicon is deposited on the layer 128. For example, this layer 130 is deposited by epitaxial growth on the layer 122 and on the remainder of the layer 128. This layer 130 forms only one and the same layer with the layer 122 such that only the layer 130 has been represented. The thickness of the layer 130 is approximately 20 µm.

A layer 132 (FIG. 5) in electrically insulating material is then deposited on the layer 130. This layer 132 is then etched by photolithography at the places where the formation of a direct electrical contact with the layer 130 is necessary. For example, the layer 132 is a layer of silicon nitride 0.1 µm thick.

A layer 134 (FIG. 6) in electrically conductive material is then deposited on the layer 132. For example, the layer 134 is a metallic layer. This layer 134 is then etched to form the different electrical contact blocks and tracks of the sensor 2.

Next, the layer 132 is etched (FIG. 7) by photolithography. The layer 130 is also etched by using the same resin mask and the oxide layers 120 and 128 as stop layer. For example, the layer 130 is etched using the DRIE (Deep Reactive Ion Etching) etching method.

Finally, the oxide layers 120 and 128 are removed (FIG. 8) to free up the different moving parts of the sensor 2.

FIG. 9 represents a sensor 140 of a component $B_Y$ of a magnetic field to be measured. The component $B_Y$ is here parallel to the direction Y. This sensor 140 is identical to the sensor 2, except that:
 the lever 52 is replaced by a lever 142,
 the hinge 66 is replaced by a hinge 144,
 the gauges 76 and 102 are replaced by gauges 146 and 148.

To simplify this figure and the subsequent figures, the processing unit 106 has not been represented.

The lever 142 is identical to the lever 52 except that it can only be displaced rotationally about a horizontal axis of rotation 150 parallel to the direction Y. Furthermore, the lever 142 comprises a counterweight 152. The counterweight 152 forms only a single block of material with the rest of the lever 142. Consequently, this counterweight 152 is rotationally displaced about the axis 150.

The weight and the dimensions of the counterweight 152 are chosen such that the center of gravity of the lever 142 is at a distance d from the axis 150 of rotation. Here, the distance d is less than 1% or 0.5% of the length, in the direction X, of the lever 142. For example, these dimensions are such that the center of gravity of the lever 142 is on the axis 150, that is to say that the distance d is less than 0.1% or 0.05% of the length of the lever 142. Such a positioning of the center of gravity relative to the axis of rotation 150 makes it possible to increase the insensitivity of the sensor 140 to the mechanical accelerations and vibrations in the direction Z.

The hinge 144 allows:

only the rotational displacement of the lever 142 about the axis 150, and the lever 142 to be kept suspended over the substrate 6.

For example, the hinge 144 is formed by a first suspended beam extending along the axis 150 and whose ends are anchored, with no degree of freedom, on one side directly to the lever 142 and on the other side to the substrate 6. The cross section of this beam is such that it can be deformed by twisting about the axis 150. Here, the hinge 144 also comprises a second beam symmetrical to the first beam relative to the plane 4 and situated on the other side of this plane 4.

The gauge 146 is identical to the gauge 76 except that the piezoresistive beam 78 is replaced by a piezoresistive beam 156. The beam 156 is identical to the beam 78, except that it extends parallel to the direction X to measure the angle of travel of the lever 142 about the axis 150.

The gauge 148 is identical to the gauge 146 but its beam 156 is positioned to measure an angular travel of the same amplitude but of opposite sign to that measured by the gauge 146.

Figure 10:
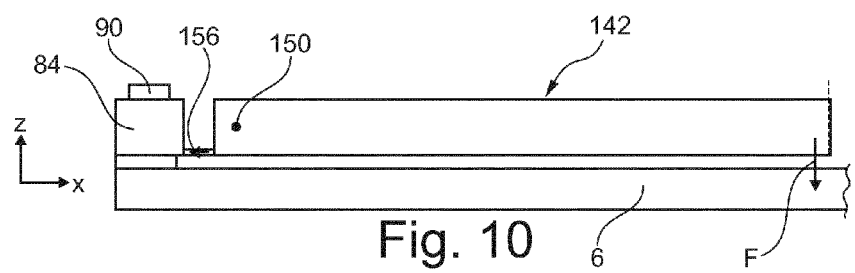
FIG. 10 is an illustration in vertical cross section of a strain gauge used in the embodiment of the sensor of FIG. 9.

FIG. 10 is a cross-sectional view of the beam 156 of the gauge 148. The thickness of the beam 156 is two, five or ten times less than the thickness of the lever 142. This makes it possible to increase the sensitivity of the sensor 140 because the strain is concentrated in a much smaller cross section.

The operation of the sensor 140 and of the following sensors is deduced from the operation described in the case of the sensor 2.

Figure 11:
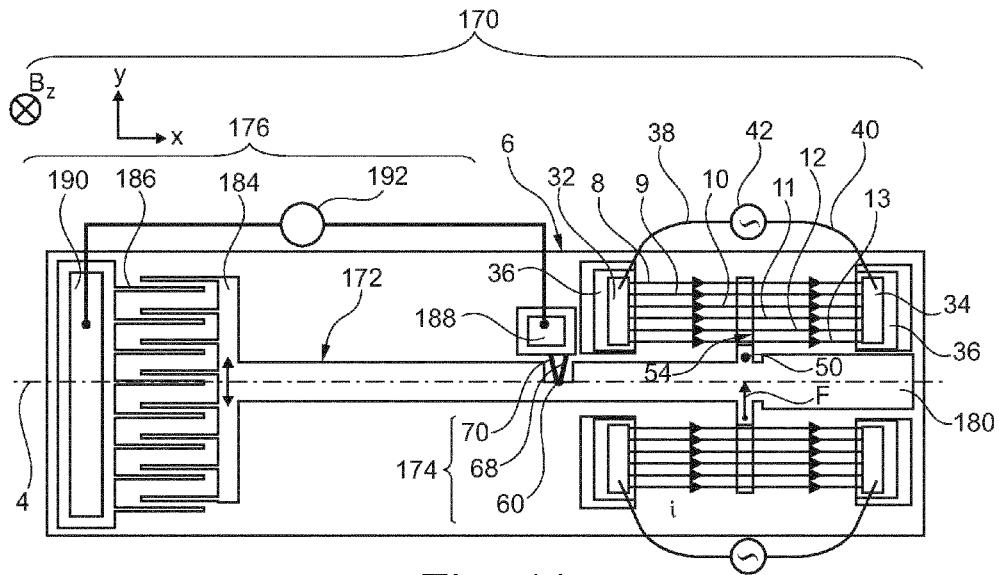

FIG. 11 represents a sensor 170 of the component $B_Z$ of the magnetic field.

This sensor 170 is identical to the sensor 2 except that:

the lever 52 is replaced by a lever 172, the hinge 66 is replaced by a hinge 174, the strain gauges 76 and 102 are replaced by a capacitive gauge 176.

The lever 172 is identical to the lever 52 except that it further comprises a counterweight 180 such that its center of gravity is at a distance d from the axis of rotation 60. As for the sensor 140, the weight and the dimensions of the counterweight 180 are chosen such that the distance d is less than 1% or 0.5% and, preferably, than 0.1% or 0.05%, of the length of the lever 172 in the direction X.

The hinge 174 is identical to the hinge 66 except that it is turned by 90° about a vertical axis relative to the position of the hinge 66 in FIG. 1. Furthermore, it is situated, in this embodiment, closer to the attachment point 50 than the end of the lever 172 where the gauge 176 is situated. Thus, in this embodiment, the lever 172 is used to amplify the angular travel provoked by the Laplace force. This makes it possible to increase the sensitivity of the sensor 170.

The gauge 176 comprises a moving armature 184 and a fixed armature 186. The armature 184 is fixed with no degree of freedom to an end of the lever 172 as far away as possible from the attachment point 50. Here, the armature 184 is situated on the other side of the axis 60 relative to the side where the point 50 is located.

The armature 186 is fixed with no degree of freedom to the substrate 6 facing the armature 184 to form a capacitor. Here, the armatures 184 and 186 are interdigital so as to increase the surface area of the faces of these armatures facing one another.

The armatures 184 and 186 are electrically connected to electrical contact blocks, respectively 188 and 190. The contact blocks 188 and 190 are electrically connected to respective terminals of a capacitance meter 192. The capacitance meter 192 generates a measurement signal representative of the amplitude of the angular travel of the lever 172 and transmits this signal to the processing unit 106.

When the Laplace force rotationally displaces the lever 172, this alters the capacitance between the armatures 184 and 186. This change of capacitance is measured by the capacitance meter 192 and transmitted to the processing unit 106. The unit 106 then computes the amplitude of the component $B_Z$ from this measurement signal.

Figure 12:
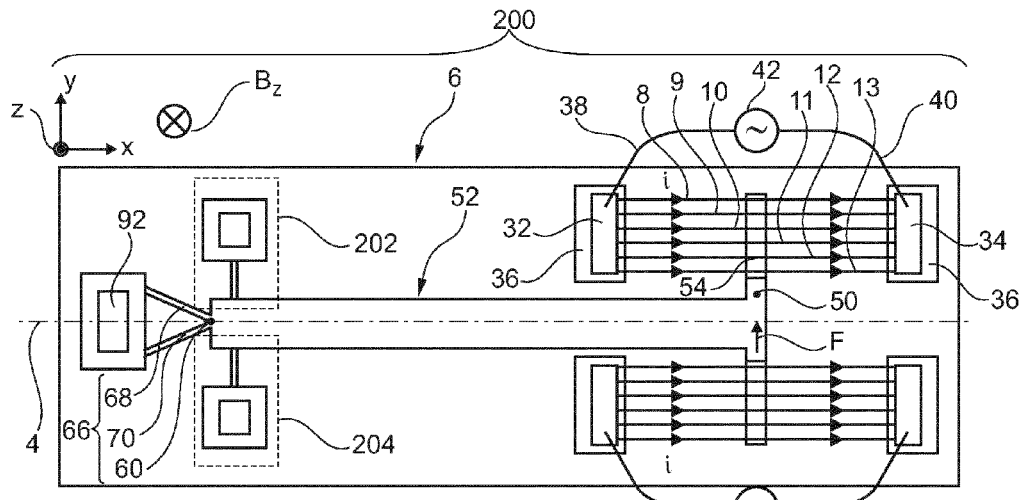
Figure 13:
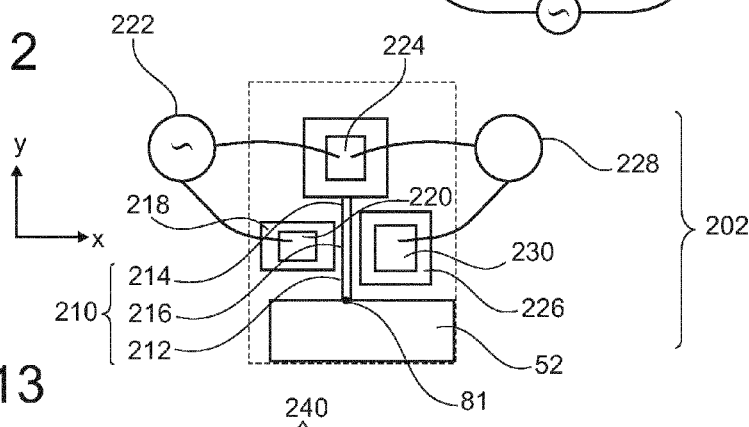
FIG. 13 is a schematic illustration of a resonant gauge used in the embodiment of FIG. 12.

FIG. 12 represents a sensor 200 identical to the sensor 2, except that the gauges 76 and 102 are, respectively, replaced by resonant gauges 202 and 204. The gauges 202 and 204 are identical to one another except that they each measure a strain of the same amplitude as that measured by the other gauge but of opposite sign. Thus, only the gauge 202 is described in more detail with reference to FIG. 13.

The gauge 202 comprises a beam 210 suspended over the substrate 6. A part 212 of this beam is anchored, with no degree of freedom in the axis of the beam, to the lever 52 at the attachment point 81. Another part 214 of this beam is anchored with no degree of freedom to the substrate. A moving part 216 of this beam is situated between the parts 212 and 214. This moving part 216 is suspended over the substrate 6 in such a way as to be able to vibrate. Typically, the beam 210 is produced in a semiconductive or conductive material. Here, it is produced in silicon.

The gauge 202 also comprises an actuation electrode 218 placed in proximity to the moving part 216 to exert on this moving part an electrostatic force which attracts it and, alternately, repels it in the direction X. To make the central part vibrate, the electrode 218 is electrically connected via an electrical contact block 220 to a terminal of an alternating voltage source 222. The alternating voltage is generated at a frequency $f_0$. Another terminal of the source 222 is directly connected to the part 214 of the beam 210 via an electrical contact block 224. Thus, in the absence of strain, the beam 210 vibrates at a frequency $f_0$.

The gauge 202 also comprises a measurement electrode 226 positioned facing the moving part 216 to form, with the moving part, a capacitor whose capacitance varies as a function of the displacement of the moving part 216. The electrode 226 is electrically connected to a terminal of a capacitance meter 228 via an electrical contact block 230. The other terminal of the capacitance meter 228 is connected to the contact block 224. Thus, the capacitance meter 228 makes it possible to measure the frequency of vibration $f_V$ of the moving part 216. The frequency $f_V$ varies as a function of the strain exerted by the lever 52 on the beam 210. This variation of the frequency $f_V$ makes it possible to measure the amplitude of the angular travel of the lever 52 and therefore the amplitude of the component $B_Z$ of the magnetic field.

Figure 14:
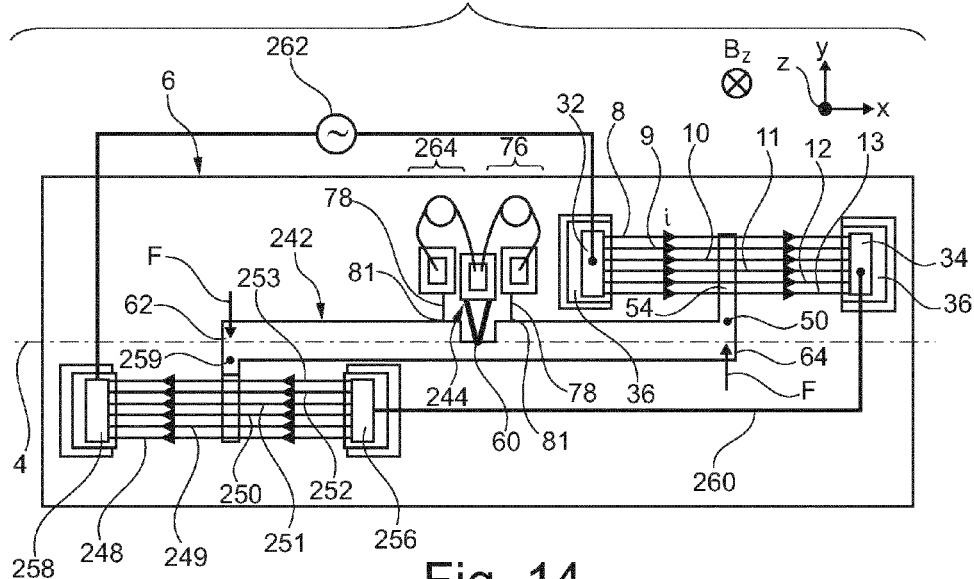

FIG. 14 represents a sensor 240 identical to the sensor 2 except that the different moving parts of the sensor are positioned symmetrically relative to the axis 60 of rotation of the lever. This makes it possible to decrease the sensitivity of the sensor to the mechanical accelerations and vibrations in the direction Y. To this end, the lever 52 is replaced by a lever 242 and the hinge 66 is replaced by a hinge 244.

The lever 242 is identical to the lever 52 but positioned symmetrically relative to the axis 60 of rotation.

The hinge 244 is identical to the hinge 66 but turned by 90° in the plane of the substrate relative to the position of the hinge 66 in FIG. 1.

The motor part, symmetrical to the motor part comprising the conductors 8 to 13 and the contact blocks 32 to 34 relative to the plane 4, is replaced by a motor part positioned symmetrically but, this time, relative to the axis 60 of rotation. The electrical conductors that are symmetrical to the conductors 8 to 13 relative to the axis 60 here respectively bear the references 248 to 253. The electrical contact blocks symmetrical to the contact blocks 32 to 34 respectively bear the references 256 and 258. The attachment point symmetrical to the attachment point 50 bears the reference 259.

To ensure that the current i flows in one direction in the conductors 8 to 13 and in the opposite direction in the conductors 248 to 253, the contact blocks 34 and 256 are directly connected electrically to one another via an electrical link 260, and the contact blocks 32 and 258 are each electrically connected to a respective terminal of an alternating current source 262.

The gauge 102 is replaced by a gauge 264. The gauge 264 is identical to the gauge 102, except that its beam 78 is placed symmetrically to the beam 78 of the gauge 76 relative to a vertical plane passing through the axis 60 and at right angles to the direction X.

Figure 15:
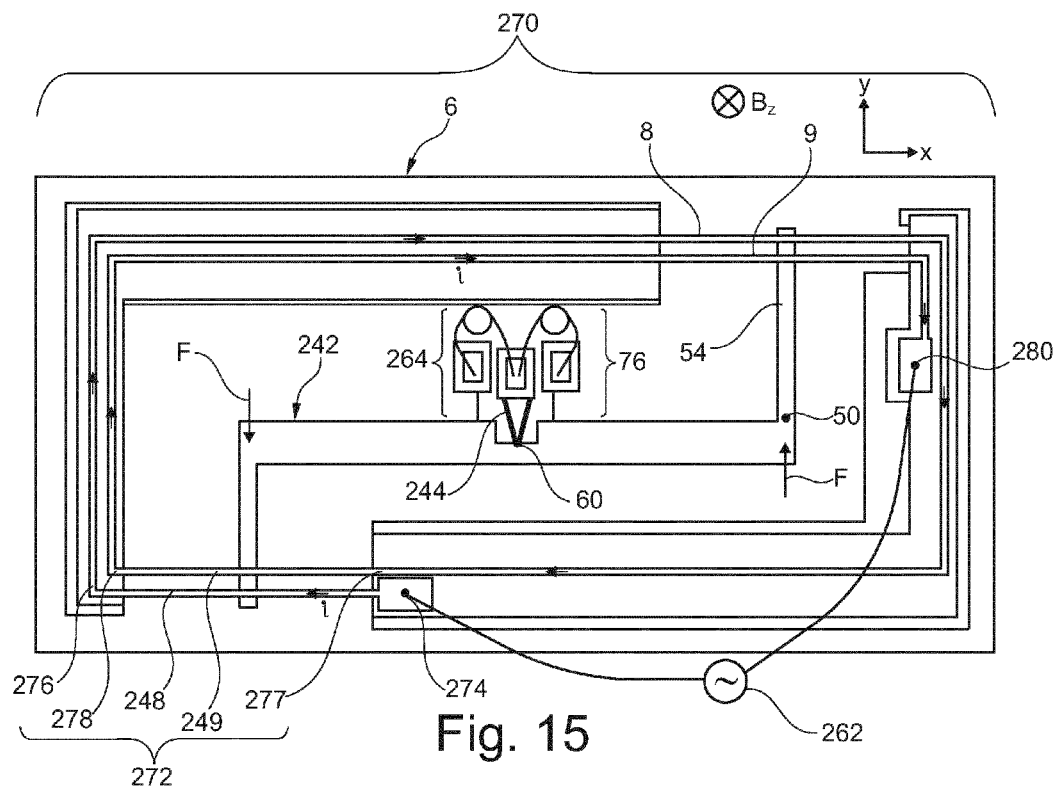

FIG. 15 represents a sensor 270 identical to the sensor 240, except that the conductors 8 to 13 and 248 to 253 are electrically connected to one another in such a way as to form a coil 272.

Here, to simplify the illustration of the coil 272, the latter is described in the case where only the conductors 8, 9, 248 and 249 exist.

The right hand end of the conductor 248 is directly connected electrically to an electrical contact block 274. The left hand end of this conductor 248 is electrically connected to the left hand end of the conductor 8 via an electrical track 276. The right hand end of the conductor 8 is electrically connected to the right hand end of the conductor 249 via an electrical track 277. The left hand end of the conductor 249 is electrically connected to the left hand end of the conductor 9 via an electrical track 278. The right hand end of the conductor 9 is directly connected to an electrical contact block 280. Thus, the coil 272 comprises two turns, the second of which is only partially complete. The contact blocks 274 and 280 and the tracks 276 to 278 are fixed with no degree of freedom to the substrate.

An electrical current source 262 is connected between the contact blocks 274 and 280 to cause the current i to flow in the conductors 8 and 9, 248 and 249.

Figure 16:
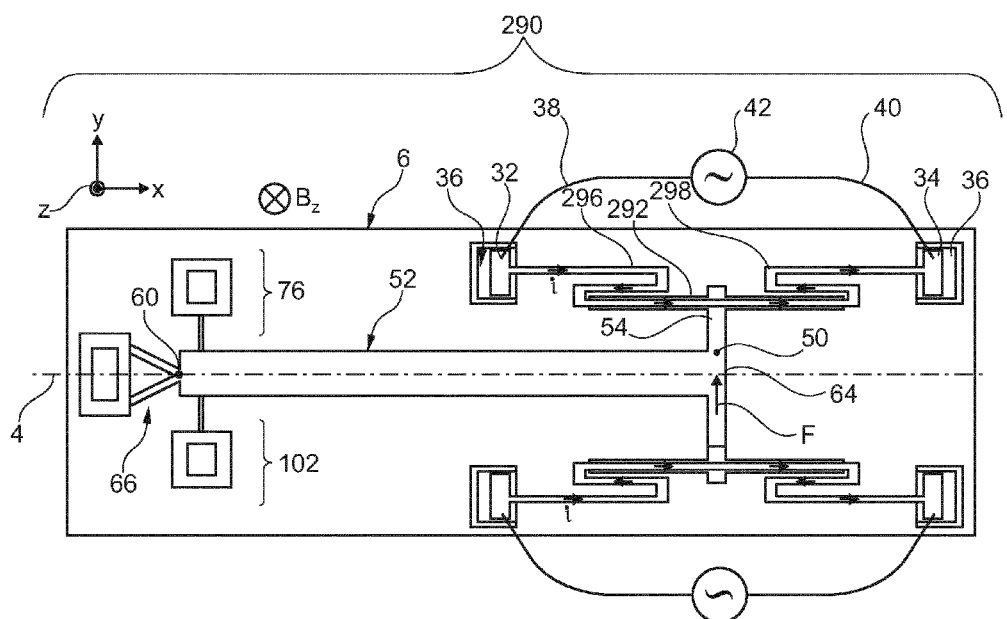

FIG. 16 represents a sensor 290 identical to the sensor 2 except that the conductors 8 to 13 are replaced by an electrical conductor 292.

The conductor 292 is rigid, that is to say that it is not deformed in the direction Y when the sensor 290 is being used to measure the component $B_Z$ of the magnetic field. The ends of the electrical conductor 292 are connected via mechanical links, respectively 296 and 298, to the substrate 6. These links 296 and 298 also electrically connect the electrical conductor 292 to the contact blocks 32 and 34. Here, these links 296 and 298 are capable:

of being deformed in the direction Y to allow the displacement, in the direction Y, of the conductor 292 under the effect of the Laplace force, and of keeping the conductor 292 suspended over the substrate 6.

To this end, the stiffness of the links 296 and 298 in the direction Y is at least 5 to 50 times less than the stiffness of these same links in the direction Z. For example, for this, each link 296 and 298 is shaped in meander form, that is to say that each forms a winding configuration which zigzags forward in the direction Y. One end of each link 296, 298 is connected with no degree of freedom to the substrate 6, while the other end is connected with no degree of freedom to a respective end of the conductor 292. By using mechanical links that are flexible in the direction Y, it is possible to increase the amplitude of the displacement of the conductor 292 and therefore the sensitivity of the sensor 290. This also makes it possible to simplify the optimization of the dimensions of the conductor 292.

Figure 17:
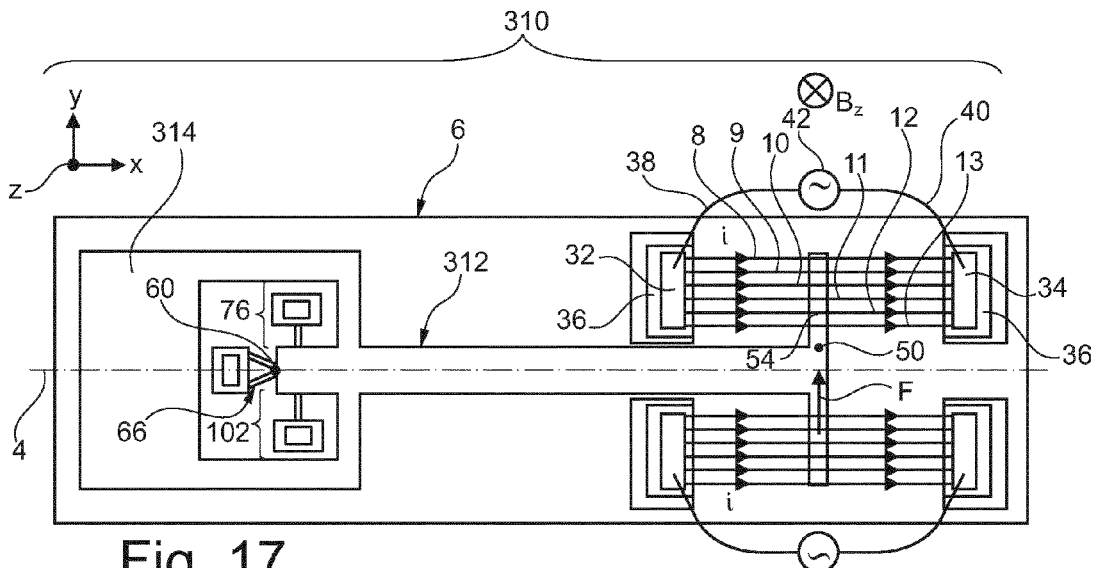

FIG. 17 represents a sensor 310 identical to the sensor 2 except that the lever 52 is replaced by a lever 312. The lever 312 is identical to the lever 52, except that it further comprises a counterweight 314. The counterweight 314 is shaped in a way similar to that which was described for the counterweight 180 in order to reduce the sensitivity of the sensor to the mechanical accelerations and vibrations in the direction Y.

Figure 18:
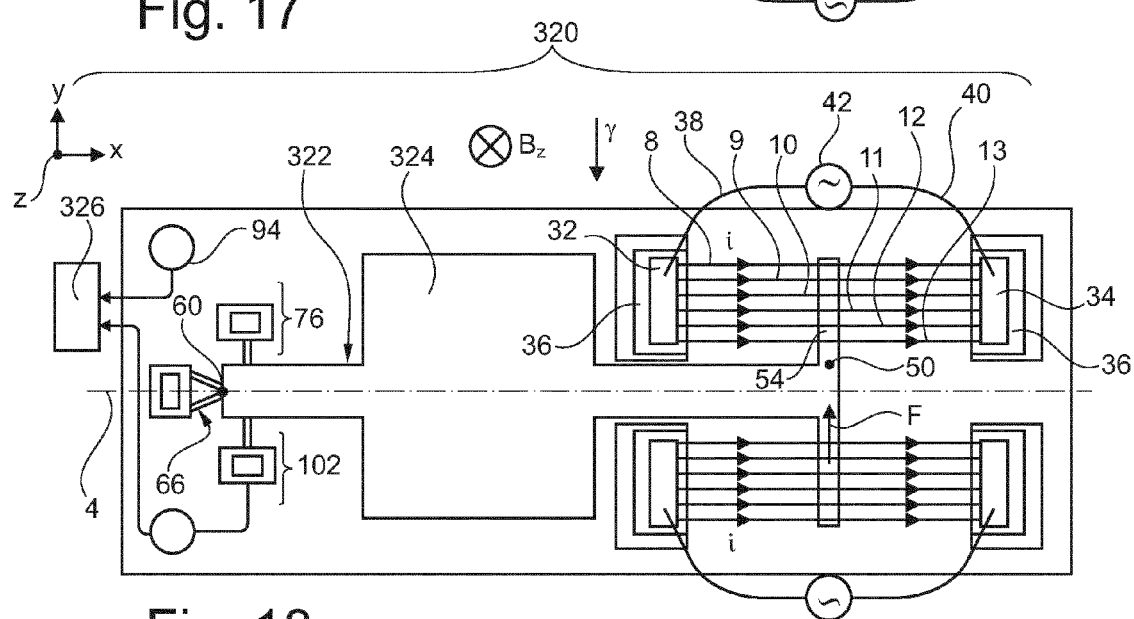

FIG. 18 represents a sensor 320 identical to the sensor 2, except that the lever 52 is replaced by a lever 322. The lever 322 is identical to the lever 52 but also comprises a flyweight 324 which moves the center of gravity of the lever 322 away from the axis 60 of rotation. For example, the shortest distance between the center of gravity of the lever 322 and the axis 60 is greater than 10 or 30% of the length of the lever 322 in the direction X. This flyweight 324 also increases the sensitivity of the lever 322 to the acceleration in the direction Y.

In this embodiment, the processing unit 106 is also replaced by a processing unit 326 capable of simultaneously measuring, in addition to the amplitude of the component $B_Z$, the component $a_Y$ of the acceleration parallel to the direction Y.

Figure 19:
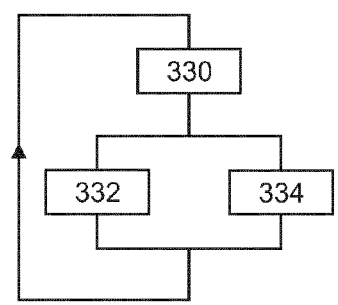
FIG. 19 is a flow diagram of a method for operating the sensor of the embodiment of FIG. 18.

The operation of the sensor 320 will now be described in more detail using the method of FIG. 19.

In a step 330, the current source 42 generates an alternating current at a frequency $f_A$, advantageously corresponding to the frequency $f_R$, very much greater than the frequency of the component $a_Y$ of the acceleration to be measured. For example, the frequency $f_R$ is greater than 1 or 2 or 10 kHz. Here, the frequency $f_A$ is chosen to be equal to 20 kHz.

Next, in a step 332, the processing unit 326 acquires the measurement signals generated by the gauges 76 and 102. In this step 332, the unit 326 filters these measurement signals to retain the component around the frequency $f_A$ by taking into account the quality factor. Typically, the component or components retained are only those whose frequency lies within the width at −3 dB of the resonance peak centered on the frequency $f_A$ in the power spectral density of the acquired signal. Then, the amplitude of the component $B_Z$ is determined only from the components of the measurement signals that have a frequency around this frequency $f_A$.

In parallel, in a step 334, the processing unit 326 filters the measurement signals to exclude therefrom the components that have a frequency greater than the bandwidth of the accelerometer. The bandwidth of the accelerometer is typically less than 2 kHz or 1 kHz and, often, less than 100 Hz. For example, only the components of the signal whose frequencies are less than four times the frequency $f_A$ are retained. Then, in this step 334, the unit 326 determines the amplitude of the component $a_Y$ only from the components retained by this filtering.

Figure 20:
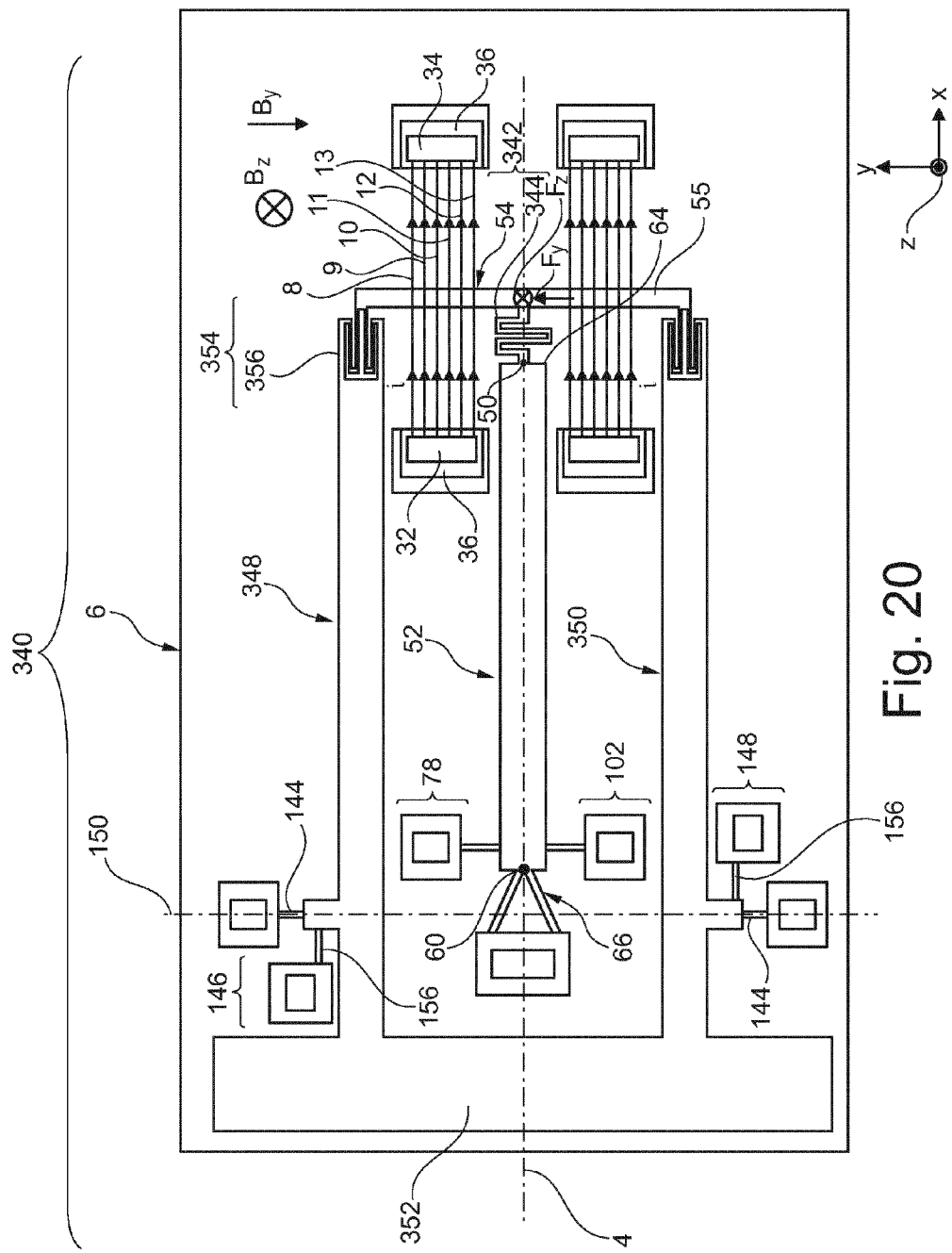

FIG. 20 represents a sensor 340 capable of measuring both the components $B_Z$ and $B_Y$ of the magnetic field. To this end, the sensor 340 combines features of the sensors 2 and 140.

More specifically, the sensor 340 comprises a sensor of the amplitude of the component $B_Z$ identical to the sensor 2, except that the link 54 is replaced by a link 342. The link 342 comprises the small beam 55 and an additional link 344 mechanically connecting this small beam 55 to the distal end 64 of the lever 52. This link 344 is shaped in meander form in a manner similar to that which has been described for the mechanical links 296 and 298 of FIG. 16. More specifically, here, this link 344 is shaped so that its stiffness in the direction Y is at least 5 to 50 times greater than its stiffness in the direction Z. To this end, the link 344 zigzags forward in the direction X.

The sensor 340 also comprises a sensor of the amplitude of the component $B_Y$ identical to the sensor 140, except that the lever 142 is replaced by two identical rigid levers 348 and 358 mounted to rotate about the axis 150. In addition, these levers 348 and 358 comprise, in place of the counterweight 152, a common counterweight 352 to decrease the sensitivity of the sensor to the mechanical accelerations or vibrations parallel to the direction Z.

The levers 348 and 350 are symmetrical to one another relative to the plane 4. Thus, only the connection of the lever 348 to the electrical conductors 8 to 13 is now described. For this, the link 54 is replaced by a link 354. The link 354 comprises the small beam 55 and, in addition, a link 356 shaped in meander form like the link 344. More specifically, the link 356 is shaped in meander form so that its stiffness in the direction Z is at least 5 to 50 times greater than its stiffness in the direction Y. To this end, it zigzags forward in the direction Y and not in the direction X.

Numerous other embodiments are possible. For example, as illustrated by FIGS. 1 and 20, the magnetic field sensor can comprise one or more measurement axes. Thus, the sensor can be mono-axial or multi-axial.

To increase the accuracy, each of the sensors previously described can be enclosed in an enclosure inside which a vacuum is created. This makes it possible in particular to increase the quality factor of the mechanical system. However, depending on the applications and the desired sensitivity, this is not absolutely necessary.

Whatever the embodiment concerned, it is possible to use only a single electrical conductor or, on the contrary, a plurality of electrical conductors in parallel. Furthermore, these electrical conductors can be connected to one another so as to form a coil as described with reference to FIG. 15.

The current which flows in the electrical conductors is not necessarily alternating. As a variant, it is a current that varies as a function of time in a non-sinusoidal manner or a direct current which never changes sign.

Whatever the embodiment, the counterweight can be omitted if it is not necessary. Similarly, the flyweight used to increase the sensitivity of the sensor to the accelerations can be omitted. In effect, all the levers are sensitive to the acceleration to varying degrees.

As a variant, one or more conductors sensitive to the Laplace force are also fixed to the lever.

Similarly, it is not necessary for the gauges which measure the amplitude of the angular travel of the lever to be mounted differentially. Thus, in a simplified variant, the sensor comprises only a single gauge to measure the angular travel of the lever.

The electrical conductor can also be produced in the form of a beam in semiconductive material that is sufficiently doped to be rendered conductive. This avoids, in this case, depositing a layer of electrically conductive material on a beam made of semiconductive material.

In the preceding embodiments, the electrical conductors extend parallel to the longitudinal axis of the lever. However, this is not absolutely necessary when the Laplace force to be measured is at right angles to the plane of the substrate. Thus, as a variant, the electrical conductors extend at right angles to the longitudinal axis of the lever.

To increase the sensitivity of the sensor, a plurality of levers and a plurality of gauges can be mounted in parallel to one another to measure the same component of the magnetic field.

When a resonant gauge is used, one and the same electrode can be used both to make the beam resonate and to measure the frequency of vibration of this beam.

The invention claimed is:

1. A magnetic field sensor with Laplace force, comprising:
a substrate extending essentially in a plane called substrate plane,
at least one electrical conductor suitable for an electrical current to flow through, the electrical conductor comprising a moving part, suspended over the substrate, suitable for being displaced in a direction of displacement when it is subjected to a Laplace force,
mechanical links mechanically connecting the moving part to the substrate and electrically connecting the moving part to current power supply contact blocks arranged on the substrate,
at least one gauge suitable for measuring a physical quantity representative of the amplitude of the displacement of the moving part, the gauge comprising at least one first and one second parts,
a suspended lever that can be rotationally displaced about an axis of rotation at right angles to the direction of displacement of the moving part, the lever comprising a first and a second distinct attachment points, the first attachment point being mechanically connected to the moving part to transmit the displacement of the moving part to the lever in such a way as to drive the lever in rotation about the axis of rotation in response to a displacement of the moving part, and the second attachment point being directly mechanically connected to the first part of the gauge, wherein:
the sensor also comprises a hinge mechanically connecting the lever to the substrate, the hinge being distinct and separate from the mechanical links of the moving part and from the first and second attachment points, the hinge allowing the rotation of the lever about its axis of rotation, and
the lever is rigid to allow for a lever arm effect, and
the second part of the gauge is fixed with no degree of freedom to the substrate.

2. The sensor as claimed in claim 1, in which the second attachment point is closer to the axis of rotation of the lever than the first attachment point, and the shortest distance between this second attachment point and the axis of rotation is less than a tenth of the length of the lever.

3. The sensor as claimed in claim 1, in which the gauge is a suspended strain gauge, comprising, in addition to the first and second parts, a third part, positioned between the first and second parts, suspended over the substrate.

4. The sensor as claimed in claim 3, in which the thickness of the third part is at least two times less than the thickness of the lever.

5. The sensor as claimed in claim 1, in which the gauge comprises two armatures facing one another forming a capacitor, one of the armatures being secured to the substrate, while the other of the armatures is mechanically connected to the second attachment point of the lever in such a way as to be displaced relative to the other armature in response to a displacement of the lever.

6. The sensor as claimed in claim 1, in which the gauge is a resonant gauge comprising:
- at least one beam suspended between the second attachment point and the substrate,
- an electrode suitable for causing the beam to vibrate,
- another electrode or the same electrode for measuring the frequency of vibration of the beam.

7. The sensor as claimed in claim 1, in which the sensor comprises at least two gauges positioned in such a way as to each measure a displacement of the lever, of opposite signs to the displacement measured by the other gauge.

8. The sensor as claimed in claim 1, in which the weight of the lever is distributed on either side of its axis of rotation in such a way that the shortest distance between the axis of rotation of the lever and the center of gravity of the lever is less than 1% of the length of the lever.

9. The sensor as claimed in claim 8, in which:
- the sensor comprises at least one first and one second copies of said at least one electrical conductor, and
- the axis of rotation of the lever is situated in the middle of the lever in the direction of its length,
- the first attachment point is mechanically connected to the first copy of said at least one conductor, and
- the lever comprises a third attachment point mechanically connected to the second copy of said at least one electrical conductor, the first and third attachment points being symmetrical to one another relative to the axis of rotation.

10. The sensor as claimed in claim 1, in which:
- the electrical conductor is rigid so as not to be deformed under the action of the Laplace force, and
- the mechanical links are configured in meander fashion to allow the electrical conductor to be displaced when it is subjected to the same Laplace force.

11. The sensor as claimed in claim 1, in which the moving part is mechanically connected to the first attachment point of the lever via a mechanical link in meander form arranged in such a way that the stiffness of this mechanical link in the direction of displacement of the moving part is at least five times greater than its stiffness in a direction orthogonal to this direction of displacement.

12. The sensor as claimed in claim 1, in which the sensor comprises a plurality of electrical conductors positioned parallel to one another.

13. A method for using a magnetic field sensor with Laplace force, the method comprising:
deploying a magnetic field sensor comprising;
- a substrate extending essentially in a plane called substrate plane,
- at least one electrical conductor suitable for an electrical current to flow through, the electrical conductor comprising a moving part, suspended over the substrate, suitable for being displaced in a direction of displacement when it is subjected to a Laplace force,
- mechanical links mechanically connecting the moving part to the substrate and electrically connecting the moving part to current power supply contact blocks arranged on the substrate,
- at least one gauge suitable for measuring a physical quantity representative of the amplitude of the displacement of the moving part, the gauge comprising at least one first and one second parts,
- a suspended lever that can be rotationally displaced about an axis of rotation at right angles to the direction of displacement of the moving part, the lever comprising a first and a second distinct attachment points, the first attachment point being mechanically connected to the moving part to transmit the displacement of the moving part to the lever in such a way as to drive the lever in rotation about the axis of rotation in response to a displacement of the moving part, and the second attachment point being directly mechanically connected to the first part of the gauge, wherein:
- the sensor also comprises a hinge mechanically connecting the lever to the substrate, the hinge being distinct and separate from the mechanical links of the moving part and from the first and second attachment points, the hinge allowing the rotation of the lever about its axis of rotation, and
- the lever is rigid to allow for a lever arm effect, and
- the second part of the gauge is fixed with no degree of freedom to the substrate;
and subsequently performing the steps;
- supplying the electrical conductor with an alternating current of fundamental frequency $f_A$,
- acquiring the signal representative of the amplitude of the displacement of the moving part,
- determining the measurement of the magnetic field only from the components of the acquired measurement signal having a frequency lying within the width at −3 dB of the resonance peak centered on the frequency $f_A$ in the power spectral density of the acquired signal,
- determining a measurement of an acceleration in the direction of displacement of the electrical conductor only from the components of the same acquired measurement signal having a frequency at least four times less than the frequency $f_A$.

* * * * *